(12) United States Patent
Chung (10) Patent No.: US 11,938,563 B2
(45) Date of Patent: Mar. 26, 2024

(54) ANNEALED WORKPIECE MANUFACTURING METHOD, LASER ANNEAL BASE STAGE, AND LASER ANNEAL PROCESSING APPARATUS

(71) Applicant: JSW AKTINA SYSTEM CO., LTD., Yokohama (JP)

(72) Inventor: Suk-Hwan Chung, Kanagawa (JP)

(73) Assignee: JSW AKTINA SYSTEM CO., LTD., Kanagawa (JP)

( * ) Notice: Subject to any disclaimer, the term of this patent is extended or adjusted under 35 U.S.C. 154(b) by 1324 days.

(21) Appl. No.: 16/342,151

(22) PCT Filed: Oct. 10, 2017

(86) PCT No.: PCT/JP2017/036656
§ 371 (c)(1),
(2) Date: Apr. 15, 2019

(87) PCT Pub. No.: WO2018/074281
PCT Pub. Date: Apr. 26, 2018

(65) Prior Publication Data
US 2019/0255650 A1   Aug. 22, 2019

(30) Foreign Application Priority Data

Oct. 20, 2016   (JP) .................. 2016-205777

(51) Int. Cl.
*B23K 26/10*   (2006.01)
*B23K 26/08*   (2014.01)
(Continued)

(52) U.S. Cl.
CPC .......... *B23K 26/103* (2013.01); *B23K 26/082* (2015.10); *B23K 26/083* (2013.01);
(Continued)

(58) Field of Classification Search
CPC ........ B23K 26/00; B23K 26/02; B23K 26/08; B23K 26/082; B23K 26/0823;
(Continued)

(56) References Cited

U.S. PATENT DOCUMENTS

| 6,145,651 | A | * | 11/2000 | Torihata | ............... | B23K 20/004 |
| | | | | | | 193/38 |
| 2009/0273878 | A1 | * | 11/2009 | Lee | ..................... | H01L 21/6831 |
| | | | | | | 361/234 |
| 2013/0273749 | A1 | * | 10/2013 | Mizumura | ........ | H01L 21/67115 |
| | | | | | | 438/795 |

FOREIGN PATENT DOCUMENTS

| CN | 103262213 A | 8/2013 |
| CN | 104508797 A | 4/2015 |

(Continued)

OTHER PUBLICATIONS

Chinese Office Action (and English language translation thereof) dated Nov. 7, 2022, issued in counterpart Chinese Application No. 201780064612.9.

(Continued)

*Primary Examiner* — Janie M Loeppke
*Assistant Examiner* — Theodore J Evangelista
(74) *Attorney, Agent, or Firm* — Holtz, Holtz & Volek PC (57) ABSTRACT

An annealed workpiece manufacturing method of irradiating a workpiece with laser light and annealing the workpiece includes a support step of supporting the workpiece, and an irradiation step of irradiating the supported workpiece with the laser light. In the support step, at least in a laser light irradiation area for the workpiece, the workpiece is supported by a cam member whose upper end height position is adjusted according to a rotation position.

5 Claims, 8 Drawing Sheets

(51) Int. Cl.
*B23K 26/082* (2014.01)
*H01L 21/20* (2006.01)
*H01L 21/268* (2006.01)
*H01L 21/683* (2006.01)

(52) U.S. Cl.
CPC .......... *H01L 21/20* (2013.01); *H01L 21/268* (2013.01); *H01L 21/683* (2013.01)

(58) Field of Classification Search
CPC .............. B23K 26/083; B23K 26/0853; B23K 26/0861; B23K 26/0892; B23K 26/10; B23K 26/103; H01L 21/20; H01L 21/26; H01L 21/263; H01L 21/268; H01L 21/67; H01L 21/68; H01L 21/683; H01L 21/6831
See application file for complete search history.

(56) References Cited

FOREIGN PATENT DOCUMENTS

| | | | |
|---|---|---|---|
| CN | 105110492 A | 12/2015 | |
| JP | 61102735 A | 5/1986 | |
| JP | S63018620 A | 1/1988 | |
| JP | 2000049110 A | 2/2000 | |
| JP | 2002231654 A | 8/2002 | |
| JP | 2002280321 A | 9/2002 | |
| JP | 2009010161 A | 1/2009 | |
| JP | 2010089142 A | 4/2010 | |
| JP | 2012124366 A | 6/2012 | |
| JP | 2014160861 A | 9/2014 | |
| KR | 20090053839 A | 5/2009 | |
| KR | 20140027916 A | 3/2014 | |
| KR | 20160086051 A * | 7/2016 | |
| TW | 201240759 A | 10/2012 | |
| WO | 2008029943 A1 | 3/2008 | |
| WO | 2012077495 A1 | 6/2012 | |
| WO | WO-2014156380 A1 * | 10/2014 | .......... H01L 21/268 |

OTHER PUBLICATIONS

International Search Report (ISR) dated Jan. 9, 2018 issued in International Application No. PCT/JP2017/036656.
Written Opinion dated Jan. 9, 2018 issued in International Application No. PCT/JP2017/036656.
English Language Translation of Written Opinion dated May 2, 2019 issued in International Application No. PCT/JP2017/036656.

* cited by examiner

ANNEALED WORKPIECE MANUFACTURING METHOD, LASER ANNEAL BASE STAGE, AND LASER ANNEAL PROCESSING APPARATUS

TECHNICAL FIELD

The present invention relates to a method of manufacturing an annealed workpiece to which an annealing process has been applied by irradiation with laser light, a laser anneal base stage on which the workpiece is supported, and a laser anneal processing apparatus that applies a laser annealing process to the workpiece.

BACKGROUND ART

According to a conventional laser anneal processing apparatus, during a laser anneal processing, a laser processing object is disposed on a specimen stage, and is irradiated with laser light. The specimen stage is manufactured in conformity with the size of the laser processing object. Recently, the laser processing object has increased in size. Accordingly, the specimen stage has increased in size with increase of the size of the laser processing object. This degrades the weight, the surface flatness, the fluctuation during movement, the variation in velocity during movement and the like. Accordingly, it is difficult to maintain specifications required for a laser processing. In particular, the laser anneal processing apparatus is used for a high-performance display, such as OLED or high-definition LCD, and the required performance is further increased. Specifically, in a laser processing to a large substrate, such as a substrate equal to or larger than 2 m, the specimen stage is difficult to satisfy specifications required for the laser processing. For example, if the surface flatness of a laser processing object is degraded, the relationship between the focal point and the irradiation position when irradiation with laser light deviates, and the anneal effect becomes uneven according to the position in some cases.

To address the cases, for example, Patent Literature 1 proposes a manufacturing apparatus which includes processing object roller conveyance means having multiple rollers, and a laser processing apparatus for processing the processing object, and in which the laser processing apparatus includes a laser oscillator, and an autofocus mechanism, and the autofocus mechanism is connected to the laser oscillator, and the laser processing apparatus irradiates a surface of the processing object with a laser beam oscillated by the laser oscillator, through the autofocus mechanism, thereby the processing can be performed.

CITATION LIST

Patent Literature

[Patent Literature 1] Japanese Patent Laid-Open No. 2010-89142

SUMMARY OF INVENTION

Technical Problem

Unfortunately, the apparatus described in Patent Literature 1 has a complicated structure. Furthermore, it is not easy for laser beam exactly auto-focusing on a processing object having a continuously varying flat surface. In particular, in a case where a line beam shape is formed and irradiation with the laser light is performed, it is difficult to adjust the focal point over the entire long axis direction through auto-focusing.

The invention of the present application has been made in view of the above situations, and has an object to provide an annealed workpiece manufacturing method, a laser anneal base stage, and a laser anneal processing apparatus that can make the flatness of a workpiece to be appropriate in the laser light irradiation area, and allow the anneal processing to be favorably performed.

Solution to Problem

That is, among annealed workpiece manufacturing methods of the present invention, a first aspect of the present invention is an annealed workpiece manufacturing method of irradiating a workpiece with laser light and annealing the workpiece, comprising: a support step of supporting the workpiece; and an irradiation step of irradiating the supported workpiece with the laser light, wherein in the support step, at least in a laser light irradiation area for the workpiece, the workpiece is supported by a cam member whose upper end height position is adjusted according to a rotation position.

The annealed workpiece manufacturing method of a second aspect of the present invention according to the first aspect of the present invention, wherein, in the irradiation step, the workpiece is irradiated, while relatively being scanned, with the laser light, and in the support step, accompanied by relative scanning with the laser light, the workpiece at least in the laser light irradiation area is supported by the cam member.

The annealed workpiece manufacturing method of a third aspect of the present invention according to the first or second aspect of the present invention, further including: a measurement step of measuring a height position of the workpiece in the laser light irradiation area; and a height position adjustment step of determining a rotation position of the cam member, based on the measured height position.

A laser anneal base stage of a fourth aspect of the present invention includes supporters that support a workpiece to be irradiated with the laser light, wherein the supporters have a cam member that supports the workpiece from a lower surface thereof in correspondence to at least an irradiation area where the workpiece is irradiated with the laser light, and a cam rotational driver that rotates the cam member.

The laser anneal base stage of a fifth aspect of the present invention according to the fourth aspect of the present invention, further comprising a scanning apparatus that relatively moves the workpiece with respect to the laser light, and performs scanning with the laser light, wherein accompanied by scanning with the laser light, the workpiece at least in the laser light irradiation area is supported by the cam member.

The laser anneal base stage of a sixth aspect of the present invention according to the fifth aspect of the present invention, wherein the cam member has an installation position fixed with respect to the irradiation position of the laser light, and other supporters that do not have the cam member can move together with the workpiece.

The laser anneal base stage of a seventh aspect of the present invention according to any of the fourth to sixth aspects of the present invention, further including: a meter that measures a height position of the workpiece, in correspondence to at least the irradiation area irradiated with the laser light; and a controller that controls the cam rotational driver, wherein the controller receives a measured result of the meter, and performs control of adjusting a rotation position of the cam member, based on the measured result, and of adjusting the workpiece to a predefined height position.

The laser anneal base stage of an eighth aspect of the present invention according to the sixth aspect of the present invention, wherein a plurality of the cam members are arranged in a lower surface direction of the workpiece, and the controller can change a rotation position independently for each of the cam members or each group of a plurality of the cam members.

The laser anneal base stage of a ninth aspect of the present invention according to any of the fourth to eighth aspects of the present invention, wherein the cam member is in contact with the workpiece and supports the workpiece.

The laser anneal base stage of a tenth aspect of the present invention according to any of the fourth to ninth aspects of the present invention, wherein the cam member supports the workpiece by gas floating.

The laser anneal base stage of an eleventh aspect of the present invention according to the tenth aspect of the present invention, wherein the cam member includes a porous material at least on a gas blowing surface side.

The laser anneal base stage of a twelfth aspect of the present invention according to the tenth or eleventh aspect of the present invention, wherein the cam member includes a blower that allows gas blown from the cam member to come into contact with a lower surface of the workpiece on an immediately upper side irrespective of a rotation position of the cam member.

The laser anneal base stage of a thirteenth aspect of the present invention according to any of the seventh to twelfth aspects of the present invention, wherein the laser light is adjusted to have a line beam shape, and is emitted to the workpiece, and a plurality of the cam members are arranged along a long axis direction of the laser light.

A laser anneal processing apparatus of a fourteenth aspect of the present invention, comprising: the laser anneal base stage according to any of the fourth to thirteenth aspects of the present invention; a laser light source that outputs laser light; and an optical system that guides the laser light, and irradiates the workpiece supported by the laser anneal base stage with the laser light.

Advantageous Effects of Invention

As described above, according to the present invention, in laser light irradiation for a workpiece, such as a laser processing object, used for a liquid crystal display or an organic EL display, the present invention has advantageous effects that can simply adjust the surface height of the workpiece, always emit the same beam by correctly adjusting the laser beam to be at or adjacent to the lens focal position, and uniformize the anneal processing for the workpiece to improve the irradiation result.

BRIEF DESCRIPTION OF DRAWINGS

Likewise.

Likewise.

Likewise.

Likewise.

Likewise.

FIG. 8 Likewise.

DESCRIPTION OF EMBODIMENTS

Figure 1:
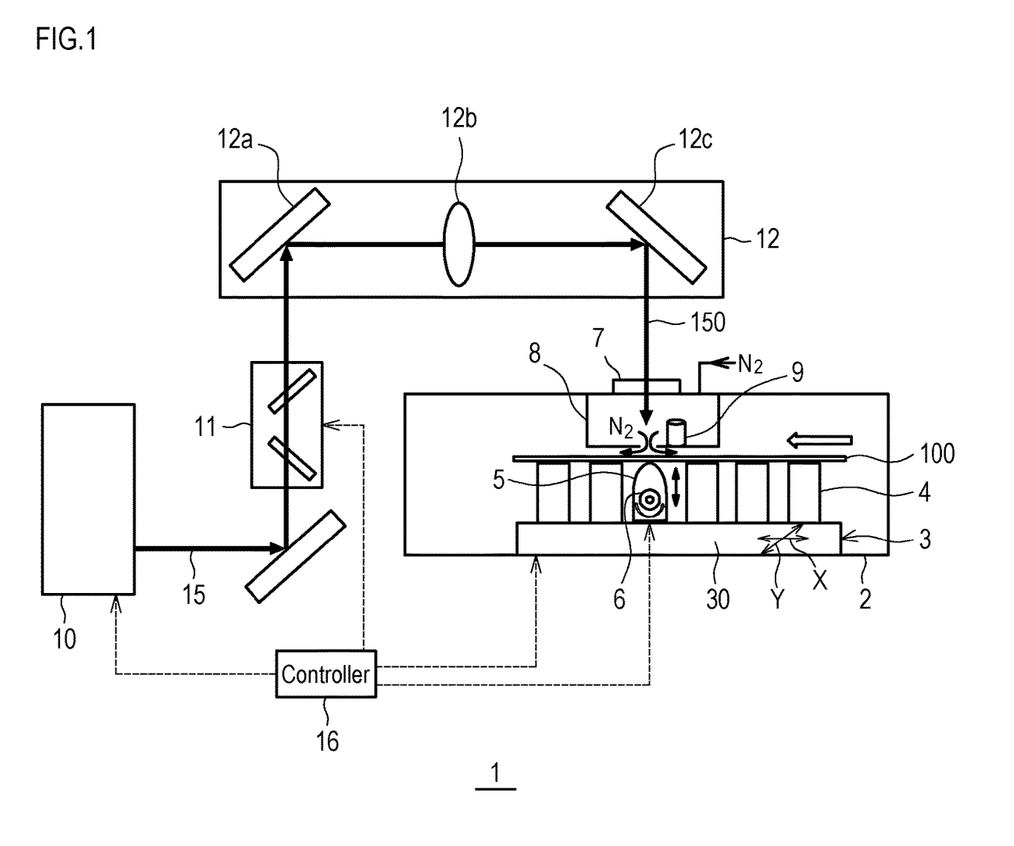
FIG. 1 is a schematic diagram showing an anneal base stage of one embodiment of the present invention, and a laser anneal processing apparatus of one embodiment that includes this anneal base stage.

Hereinafter, an anneal base stage, and a laser anneal processing apparatus that includes this anneal base stage according to one embodiment of the present invention are described with reference to FIG. 1.

The laser anneal processing apparatus 1 includes a processing chamber 2. A scanning apparatus 3 is provided in the processing chamber 2. The scanning apparatus 3 includes a scanning-directional movement section 30 that is movable in an X direction (scanning direction). Above the scanning-directional movement section 30, multiple supporters 4 that move together with the scanning-directional movement section 30 are provided. The supporters 4 are arranged in the X direction and the Y direction at intervals; multiple supporters are arranged in each direction of the X direction and the Y direction. Tops thereof serve as mounts on which a workpiece is mounted. In this Embodiment 1, the supporters 4 are formed to have columnar shapes, and their top surfaces serve as mounts.

The scanning-directional movement section 30 can be moved along a guide or the like provided extending in the X direction above a base of the processing chamber 2, is driven by a motor or the like not shown, and can move the supporters 4 in a laser light scanning direction. Furthermore, the scanning-directional movement section 30 can move in the Y direction to change the irradiation position.

Below an irradiation area to be irradiated with laser light, cam members 5 are disposed along the Y direction (a direction orthogonal to the scanning direction). The cam members 5 constitute a part of the supporters of the present invention. The cam members 5 are disposed along the Y direction at intervals in order to not being disposed on an X direction line on which the supporters 4 move. Accordingly, when the supporters 4 move together with the scanning-directional movement section 30, the supporters 4 do not interfere with the cam members 5. Drive motors 6 are coupled with the respective cam members 5, each drive motor being for adjusting the rotation position of the corresponding cam member 5. A stepping motor or the like can be adopted as the drive motor 6. The drive motor 6 corresponds to a cam rotational driver of the present invention. The type of the cam rotational driver is not specifically limited. The cam members 5 support the workpiece on top sides thereof. The positions and heights of the tops can be changed by rotation of the cam members 5. The rotation position can be changed to any position. Alternatively, the rotation position can be changed through selection among predefined positions.

The scanning apparatus 3 including the aforementioned scanning-directional movement section 30 and the guide or the like, the supporters 4, the cam members 5, and the drive motors 6 are configuration elements of the anneal base stage of the present invention.

It is not indispensable to have a plurality of cam members 5 in the present invention.

The processing chamber 2 is provided with an introduction window 7 for introducing a line beam from the outside.

In the processing chamber 2, an injection cylinder 8 configured to surround the optical path of laser light 150 is provided below the introduction window 7. A transmission part, such as a hole, allowing the laser light to pass there through is formed on the lower surface of the injection cylinder 8.

A height meter 9 is provided on the lower surface of the injection cylinder 8, this meter measuring the upper surface height of the workpiece that is disposed below and is moving. The height meter 9 can be the device that continuously or intermittently measures the height of a measurement point. The configuration of the height meter 9 is not specifically limited. This meter measures the height of the workpiece using an optical sensor or the like, for example. The height meter 9 corresponds to a meter of the present invention. The height meter 9 can be the device that can measure the height position of the workpiece at an irradiation position of the laser light 150 or adjacent thereto, and can be arranged at an appropriate position, which is not limited to that of the injection cylinder 8, and can be the device that performs measurement at multiple positions. In a case where the irradiation laser light is a line beam, it is desired to measure the position of the workpiece along the short axis direction (Y direction). The height meter 9 can be the device that uses a line sensor or multiple sensors.

During a laser process, a semiconductor substrate 100 that includes an amorphous silicon film such as a glass substrate or the like formed thereon is disposed at the center of the scanning-directional movement section 30. The semiconductor substrate 100 corresponds to a workpiece of the invention of the present application. In the present invention, the workpiece is not limited to the semiconductor substrate.

The laser anneal processing apparatus 1 of this Embodiment 1 is described as the device that pertains to a laser annealing process for crystalizing the amorphous film through a laser process. However, the invention of the present application does not limit the details of the laser processing to crystallization of the amorphous film. Alternatively, for example, the processing can be single crystallization of a non-single-crystal semiconductor film, or reforming of a crystal semiconductor film. Alternatively, this processing can pertain to another processing. As described above, the workpiece is not limited to a specific one.

A laser light source 10 is installed outside of the processing chamber 2. The laser light source 10 can be the device that outputs any of pulse oscillation laser light and continuous oscillation laser light. The present invention is not specifically limited to any of them, and can adopt multiple laser light sources. Note that in this Embodiment 1, use of pulse oscillation laser light having a higher energy density is preferable. In this Embodiment 1, for example, pulse oscillation laser light is exemplified that has a wavelength equal to or less than 400 nm and a pulse half-width equal to or less than 200 nanoseconds.

The energy density of the pulse laser light 15 output from the laser light source 10 is adjusted by an attenuator 11 as required. An optical system 12 that includes a reflective mirror 12a, a condenser lens 12b and a reflective mirror 12c or the like adjusts the light to have a line beam shape or the like, and deflects the light, and emits the light as the laser light 150. The optical members constituting the optical system 12 are not limited to those defined above. Various lenses, mirrors, waveguides and the like are appropriately included. The sectional shape of the line beam shape is not specifically limited, but can be exemplified as, a shape having the length of a short axis width of 100 μm to 500 μm and the length of a long axis width of 370 mm to 1,300 mm on the irradiation surface of the workpiece, for example.

In this Embodiment 1, the description is made with the beam sectional shape of the laser light 150 with which the workpiece is irradiated is a line beam shape. However, the present invention is not limited thereto. The sectional shape can be an appropriate irradiation shape, such as a spot shape, a circular shape, a rectangular shape.

The laser anneal processing apparatus 1 further includes, at least, a controller 16 that controls the scanning apparatus 3, the drive motor 6, the laser light source 10 and the attenuator 11 respectively. The controller 16 can be configured by a CPU, a program causing the CPU to perform a predetermined operation, a storage and the like.

The scanning apparatus 3 can move the scanning-directional movement section 30 together with the supporters 4 at a predetermined velocity under the control of the controller 16. The predetermined velocity is not specifically limited, but can be exemplified as 1 to 100 mm/sec, for example. Note that the scanning apparatus 3 can change the scanning position by moving the scanning apparatus 3 in the Y direction.

The controller 16 can control the laser light source 10 to output the laser light 15 at a predetermined output, and can further control the attenuator 11 to achieve control so as to irradiate the workpiece with the laser light 150 at a predetermined energy density. The energy density on the workpiece can be set to have an appropriate value according to an object of annealing and the like.

Next, the cam members 5 are described with reference to FIG. 2.

Figure 2:
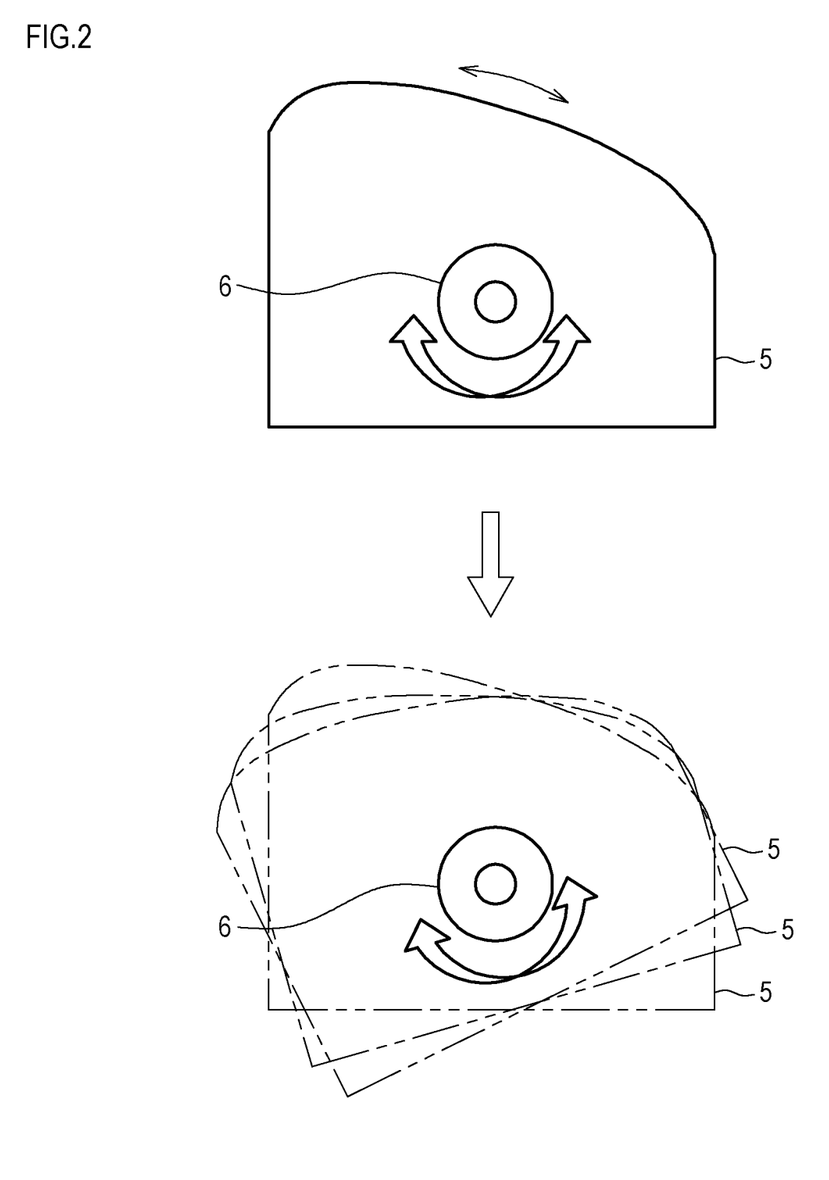
FIG. 2 shows a cam member and a drive motor, and a state where the cam member rotates.

FIG. 2 is a front view of one of the cam members 5 in the Y directional view. The upper surface has an inclined and curved shape. The cam member 5 has a rotation shaft along the Y direction on the lower side. The drive motor 6 is coupled with the rotation shaft. The cam member 5 can be rotated along the rotation shaft by the drive motor 6. When the cam member 5 is rotated, the maximum height position thereof is changed as shown in the lower diagram of FIG. 2. In this Embodiment 1, the semiconductor substrate 100 is supported on the upper surface of the cam member 5. Consequently, the height position of the semiconductor substrate 100 is changed on the cam member 5 according to the rotation position of the cam member 5. By arranging the cam member 5 immediately below the laser light 150 or adjacent thereto, the height position of the semiconductor substrate 100 irradiated with the laser light 150 can be adjusted by the rotational operation of the cam member 5. The upper surface of the cam member 5 does not necessarily have the curved shape. Alternatively, the inclined angle can stepwise vary.

Next, the operation of the laser anneal processing apparatus 1 is described.

The laser light source 10 pulse-oscillates at a predetermined repetitive frequency under the control of the controller 16, and the laser light 15 is output at a predetermined output. The laser light 15 is exemplified that has a wavelength equal to or less than 400 nm and a pulse half-width equal to or less than 200 nanoseconds, for example. However, the present invention is not limited thereto.

The pulse energy density of the laser light 15 is adjusted by the attenuator 11 controlled by the controller 16. The attenuator 11 is set to have a predetermined attenuation rate. The attenuation rate is adjusted so as to achieve an irradiation pulse energy density that is optimal for crystallization on the irradiation surface towards the semiconductor substrate 100. For example, in a case where an amorphous silicon film is crystallized, the energy density can be adjusted to range from 250 to 500 mJ/cm$^2$ on the irradiation surface.

The laser light 15 having transmitted through the attenuator 11 is adjusted by the optical system 12 to have a line beam shape and the short axis width thereof is condensed, and is introduced as the line beam laser light 150 into the introduction window 6 provided on the processing chamber 2.

For example, the line beam is adjusted to have a long-axis length of 370 mm to 1300 mm and a short-axis length of 100 μm to 500 μm.

The scanning apparatus 3 controlled by the controller 16 moves the semiconductor substrate 100 at a predetermined scanning velocity, thereby allowing the semiconductor substrate 100 to be irradiated with the line beam laser light 150 while relatively scanning the semiconductor substrate 100. The scanning velocity in this case is set within a range from 1 to 100 mm/sec. However, the present invention is not limited to the case having a specific scanning velocity as described above.

The scanning pitch is not limited to have a specific numerical value. For example, the scanning pitch can range from 5 μm to 15 μm. According to the present invention, by moving the laser light, the laser light can be relatively moved with respect to the semiconductor substrate 100. The laser light can be moved by moving an optical fiber allowing the laser light to pass there through, for example.

Next, the operation of the supporters 4 during irradiation with the line beam laser light 150 is described.

In this Embodiment 1, the height position of the semiconductor substrate 100 is measured by the height meter 9, and a measured result is transmitted to the controller 16. The controller 16 controls the drive motor 6 and adjusts the rotation position of the cam member 5 on the basis of the measured result such that the semiconductor substrate 100 can be at a predetermined height position. Accordingly, it is desired to dispose the height meter 9 at a position that is upstream side of the positions of the cam members 5 in the conveyance direction of the semiconductor substrate 100 conveyed by the scanning apparatus 3, can emit the laser light 150 with the measured result being reflected in adjustment of the rotation positions of the cam members 5, and is closer to the cam member 5 as much as possible. The predetermined height position can have a predetermined value, or a value defined in conformity with the scanning direction of the semiconductor substrate 100. That is, it is only required to be capable of adjusting the height of the semiconductor substrate 100 to a predefined height position.

As for a plurality of cam members 5 arranged along the Y direction, all or some of the cam members 5 can perform the same operation. Alternatively, the rotation positions of these members can be allowed to be separately adjusted. In the case of separately adjusting the rotation positions of the cam members 5, the measured results measured by the height meter 9 at positions corresponding to the positions of the cam members 5 can be respectively used, and adjustment can be made to achieve the height position uniform in the short axis direction (Y direction). In this case, the height meter 9 can continuously measure the height position in the Y direction, or measure the height position at multiple sites.

Figure 3:
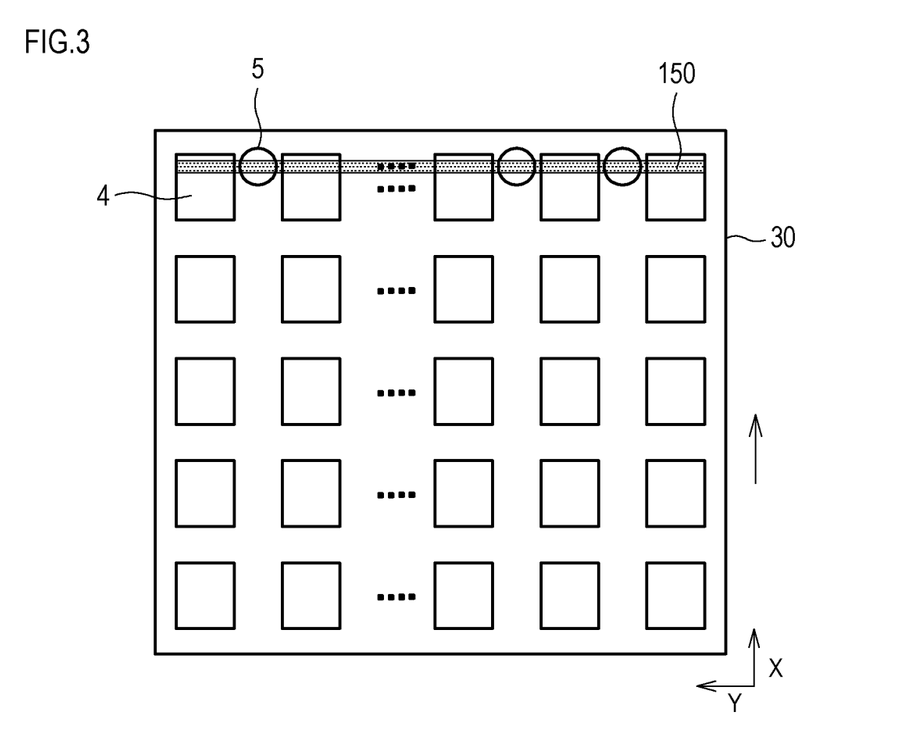
FIG. 3 shows the positional relationship between the supporters and the cam members during laser light scanning.

FIG. 3 shows a state where the distal end of the semiconductor substrate 100 in the X direction reaches the cam members 5 when the semiconductor substrate 100 is moved by the scanning-directional movement section 30. In the diagram, illustration of the semiconductor substrate 100 is omitted.

In this diagram, the distal end of the semiconductor substrate 100 in the X direction is adjusted to a predetermined height by rotation of the cam members 5. An appropriate focal position is irradiated with the laser light 150, and a favorable anneal processing is performed.

While the semiconductor substrate 100 is moved by the scanning-directional movement section 30 in the X direction, and the appropriate focal position is irradiated with the laser light 150.

Figure 4:
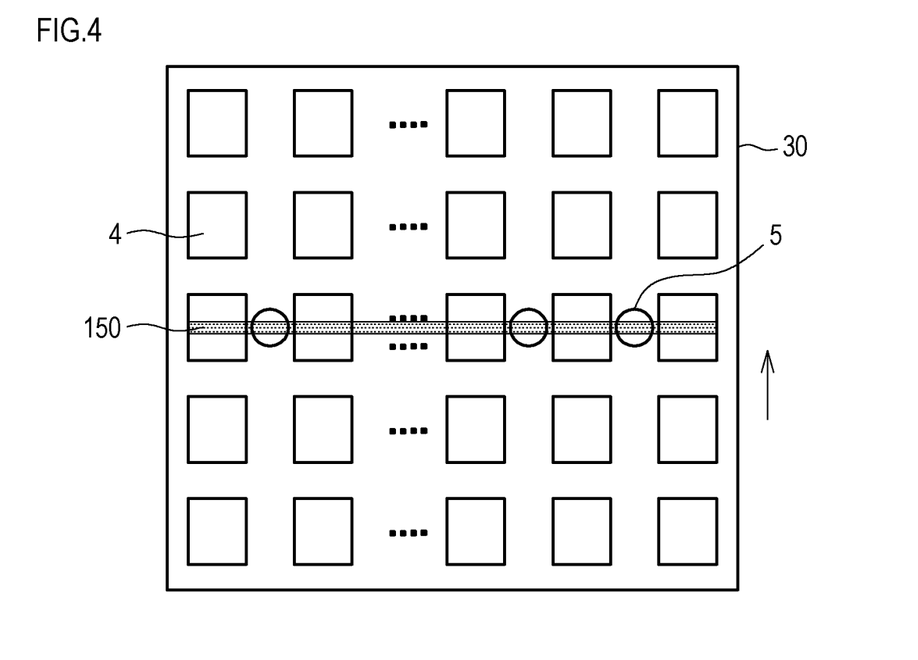
FIG. 4 shows the positional relationship between the supporters and the cam members during laser light scanning.
Figure 5:
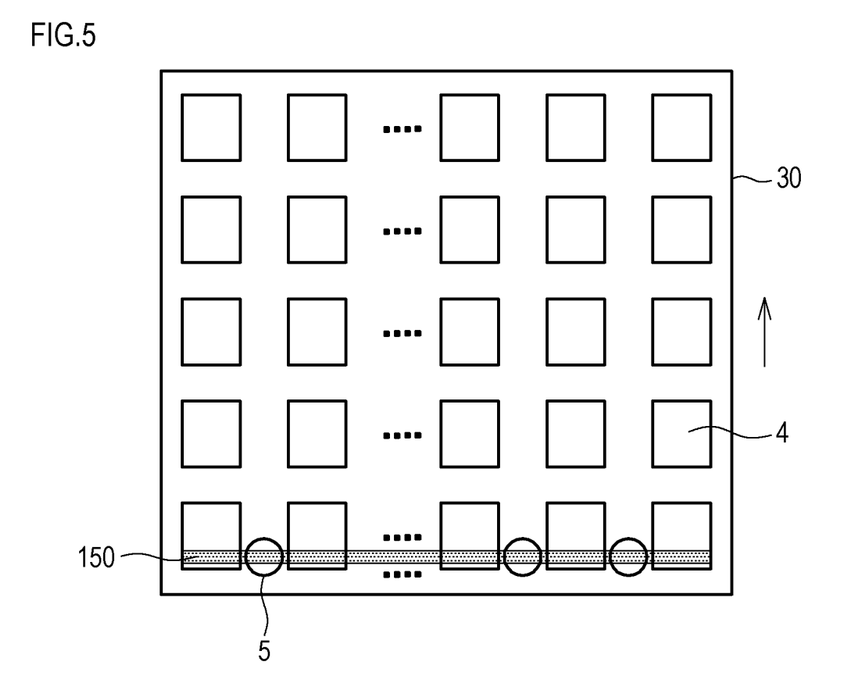
FIG. 5 shows the positional relationship between the supporters and the cam members during laser light scanning.

FIG. 4 shows a state where the movement of the semiconductor substrate 100 advances and the middle of the semiconductor substrate 100 in the X direction is positioned on the cam members 5 and the height thereof is adjusted. FIG. 5 shows a state where the movement of the semiconductor substrate 100 advances and a rear end part of the semiconductor substrate 100 in the X direction is positioned on the cam members 5 and the height thereof is adjusted. Meanwhile, the cam members 5 are at fixed positions. With respect to the laser light 150 whose irradiation position is fixed, the height of the semiconductor substrate 100 is adjusted at the same position.

In a case where irradiation on a second line in the scanning direction is to be made, the semiconductor substrate 100 is moved in the lateral direction by a moving apparatus, not shown, after completion of irradiation on the first line. The laterally moved semiconductor substrate is then subjected to the movement of the semiconductor substrate and the laser light irradiation, which have been described above. After the entire glass surface processing to the semiconductor substrate is completed, the next substrate is processed.

The above description has been made, assuming the cam members 5 have the rotation shafts along the Y direction. Alternatively, the cam members can have rotation shafts inclined from the X direction or the Y direction on the horizontal surface. Furthermore, alternatively, the cam members can have rotation shafts inclined from the vertical direction, or can have multiple rotation shafts and be rotationally adjustable about the respective rotation shafts, or can rotationally adjusting the cam members 5 about free rotation shafts.

In this Embodiment 1, the cam members 5 are directly in contact with the semiconductor substrate 100 and adjust the height position. During movement of the semiconductor substrate 100, the semiconductor substrate 100 can be slid on the cam members 5, or the cam members 5 can be provided with rotational rollers and the like to allow the semiconductor substrate 100 to be capable to move. Furthermore, alternatively, during movement of the semiconductor substrate 100, the contact with the semiconductor substrate 100 can be temporarily released by rotation of the cam members 5.

As described above, the height position of the semiconductor substrate 100 can be simply and correctly adjusted by the cam members 5. An appropriate positional relationship between the semiconductor substrate 100 and the focal position of the laser light can be achieved. Accordingly, the annealing process can be favorably performed.

In this Embodiment 1, the supporters 4 and the cam members 5 constitute the supporters, and only the supporters 4 are moved. Consequently, the supporting structure can thus be divided so that the moving side can be configured to be small. Accordingly, the drawbacks due to the weight, the surface flatness, the fluctuation during movement, the variation in velocity during movement and the like on the moving side can be reduced.

Note that in this Embodiment 1, there is no division of the moving side of the scanning apparatus, the entire supporters can be moved. In this case, it is assumed that a plurality of the supporters arranged in the X direction have cam member structures. Accompany with movement of the semiconductor substrate 100 by the scanning apparatus 3, the height of the semiconductor substrate 100 can be adjusted by rotation of the cam members 5 on the cam members 5 corresponding to the irradiation area of the laser light 150.

In Embodiment 1 described above, the semiconductor substrate 100 is pressed and directly supported by the supporters 4 and the cam members 5. Alternatively, a structure can be adopted where the semiconductor substrate is floated and supported by injecting gas upward on the supporters. Hereinafter, this Embodiment 2 is described.

Figure 6:
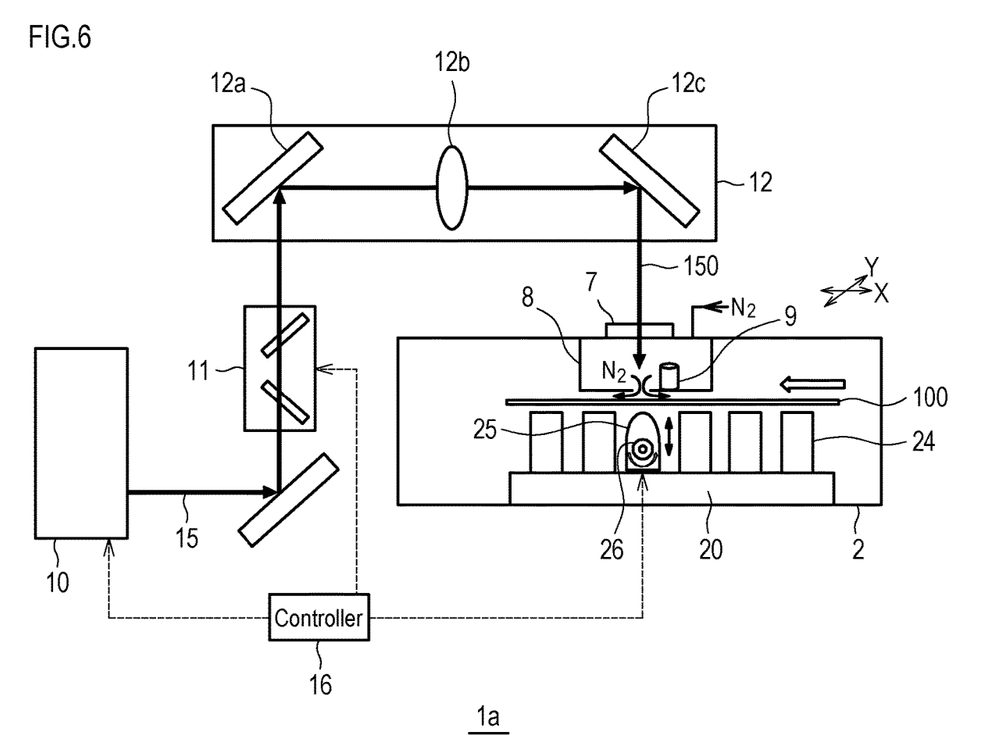
FIG. 6 is a schematic diagram showing an anneal base stage of another embodiment of the present invention, and a laser anneal processing apparatus of one embodiment that includes this anneal base stage.

FIG. 6 shows a laser processing apparatus of Embodiment 2 that is another embodiment. Configuration elements analogous to those in the embodiment described above are assigned the same symbols. The description thereof is omitted or simplified.

In Embodiment 2, a supporter fixation apparatus 20 is provided in the processing chamber 2. A plurality of supporters 24 are provided and fixed on the supporter fixation apparatus 20 along the X direction and Y direction. Below the irradiation position irradiated with the laser light 150, cam members 25 are arranged along the Y direction. Drive motors 26 are coupled with rotation shafts of the cam members 25. The drive motor 26 corresponds to a rotational driver of the present invention.

At the supporters 24, the semiconductor substrate 100 is floated by blowing floating gas upward so that the semiconductor substrate 100 is floated from the blowing position by a predetermined amount in height.

The blowing positions are configured for the cam members 25 according to the rotation positions of the cam members 25. Blowing is set such that the gas can be blown immediately upward from the cam members 25 as much as possible.

The type of the floating gas is not limited to a specific one in the present invention. For example, inert gas such as nitrogen can be adopted.

Figure 7:
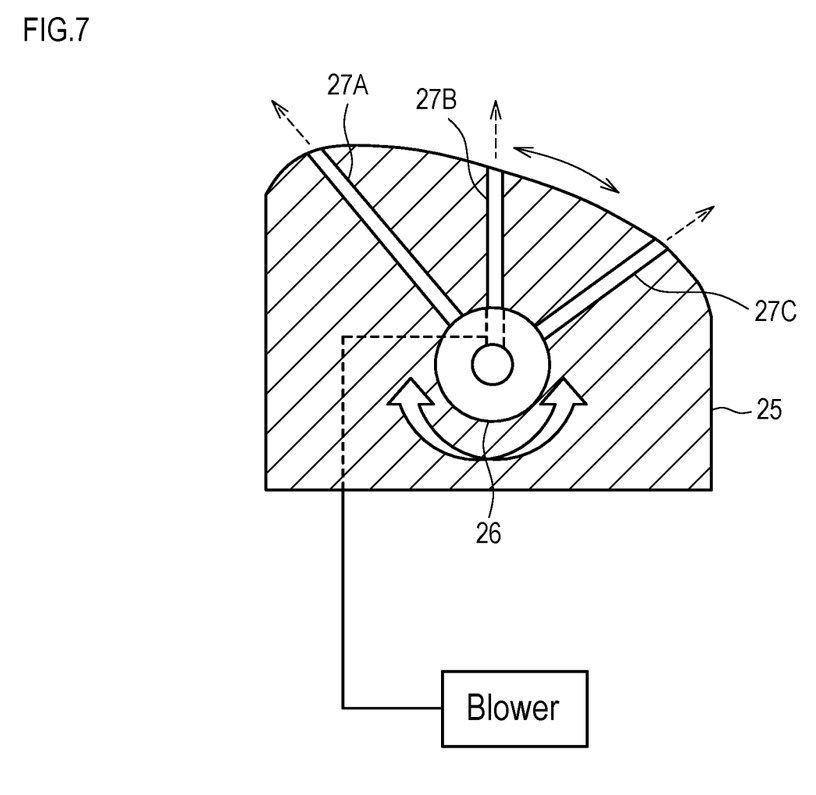
FIG. 7 shows the cam member and the drive motor.

FIG. 7 shows an example of cam members 25, and shows a porous structure provided with three blowing ports 27A, 27B and 27C through which gas supplied by a blower is blown. At each of the blowing ports, valve structures can be provided at the respective blowing ports so as to blow gas only from blowing ports that blow gas most immediately upward according to the rotation positions of the cam members 25, or connections of the blowing paths can be switched. Accordingly, when the cam members 25 rotate, the semiconductor substrate 100 can be floated by a predetermined amount in height from the blowing ports at a directly upward side. Consequently, the height of the semiconductor substrate 100 can be adjusted.

As for a plurality of cam members 25 arranged along the Y direction, all or some of the cam members 25 can perform the same operation. Alternatively, the rotation positions of the cam members can be separately adjusted. In the case of separately adjusting the rotation positions of the cam members 25, the measured results measured by the height meter 9 at positions corresponding to the positions of the cam members 25 can be respectively used. In this case, the height meter 9 can continuously measure the height position in the Y direction, or measure the height position at multiple sites.

The above description has been made, assuming that the cam members 25 have the rotation shafts along the Y direction. Alternatively, the cam members can have rotation shafts inclined from the X direction and the Y direction on the horizontal surface direction. Furthermore, alternatively, the cam members can have rotation shafts inclined from the vertical direction, or can have multiple rotation shafts and rotationally adjustable about the respective rotation shafts, or can rotationally adjusting the cam members 25 about free rotation shafts.

Use of the mechanism of floating the workpiece as described above eliminates the need to move the supporters. Furthermore, the adverse effect of reflection from the lower side in the laser light irradiation area can be eliminated. Furthermore, the workpiece does not come into contact with the supporters. Accordingly, occurrence of particles and static electricity can be suppressed, thereby improving the processing quality.

In the embodiments described above, the heights of the blowing ports can be adjusted by the cam members. Consequently, the gas blowing rate can be reduced. According to gas blowing, as the floating amount is increased, the workpiece floated by the gas tends to fluctuate. However, this embodiment can suppress the fluctuation.

Figure 8:
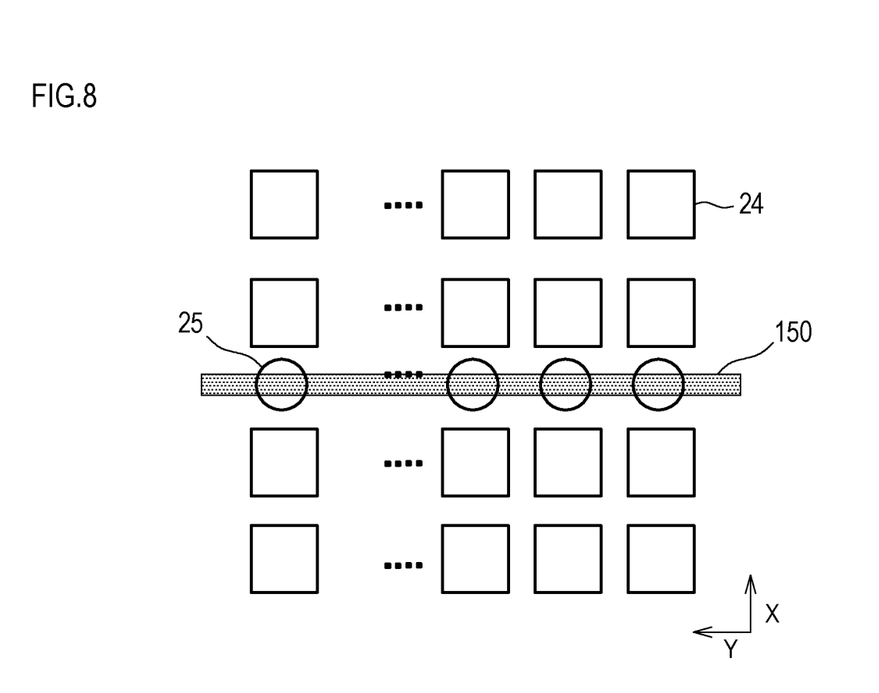
FIG. 8 shows the positional relationship between the supporters and the cam members.

FIG. 8 shows a state where the semiconductor substrate (not shown) floated by the gas is irradiated with the laser light 150. The semiconductor substrate 100 can be moved by pushing the semiconductor substrate 100, or by using a moving apparatus (not shown) that holds and moves the semiconductor substrate 100.

The height of the semiconductor substrate 100 is adjusted in the irradiation area by the cam members 25. This substrate is irradiated with the laser light 150, with an appropriate positional relationship with the focal position of the laser light 150 being kept, and is subjected to a favorable anneal processing.

Embodiment 2 is described assuming that all the supporters are fixed and gas floating is performed. Alternatively, a structure can be adopted that is movable except the cam members 25. Gas floating can be performed only by the cam members 25.

The present invention has been described based on the embodiments. It is a matter of course that the embodiments can be appropriately changed unless departing from the range of the present invention.

REFERENCE SIGNS LIST

1 Laser processing apparatus
1a Laser processing apparatus
2 Processing chamber
3 Scanning apparatus
4 Supporter
5 Cam member
6 Drive motor
7 Insertion window
8 Injection cylinder
9 Height meter
10 Laser light source
12 Optical system
15 Laser light
16 Controller 24 Supporter
25 Cam member
26 Drive motor
30 Scanning-directional movement section
100 Semiconductor substrate
150 Laser light

The invention claimed is:

1. An annealed workpiece manufacturing method of irradiating a workpiece with laser light and annealing the workpiece, the method comprising:
 a support step of supporting the workpiece, wherein in the support step, at least in a laser light irradiation area of the workpiece on which laser light having a line beam shape is irradiated, the workpiece is supported by a plurality of cam members arranged along a long axis direction of the laser light;
 an irradiation step of irradiating the supported workpiece with the laser light;
 a measurement step of measuring a height position of the workpiece along the long axis direction of the laser light in the laser light irradiation area; and
 a height position adjustment step of determining a rotation position of each cam member, based on the measured height position,
 wherein:
 an upper end height position of each of the cam members is adjustable according to the rotation position thereof,
 the rotation position of each of the cam members or of each group including a plurality of the cam members is independently controllable,
 each cam member includes a blower that causes gas blown from the cam member to come into contact with a lower surface of the workpiece on an immediately upper side of the cam member, irrespective of the rotation position of the cam member,
 in the irradiation step, the workpiece is irradiated, while relatively being scanned, with the laser light, and
 in the support step, accompanied by relative scanning with the laser light, the workpiece, at least in the laser light irradiation area, is supported by gas floating caused by the cam members.

2. A laser anneal base stage comprising:
 a plurality of supports that support a workpiece to be irradiated with laser light having a line beam shape, wherein the supports include a plurality of cam members that are arranged along a long axis direction of the laser light and support the workpiece from a lower surface thereof in correspondence to at least an irradiation area where the workpiece is irradiated with the laser light, wherein each cam member includes a cam rotational driver that rotates the cam member, and wherein each cam member includes a blower that causes gas blown from the cam member to come into contact with a lower surface of the workpiece on an immediately upper side of the cam member, irrespective of a rotation position of the cam member;
 a scanning apparatus that relatively moves the workpiece with respect to the laser light, and performs scanning with the laser light, wherein, accompanied by scanning with the laser light, the workpiece, at least in the laser light irradiation area, is supported by gas floating caused by the cam members;
 a meter that measures a height position of the workpiece along the long axis direction of the laser light in the irradiation area irradiated with the laser light; and
 a controller that controls the cam rotational driver,
 wherein:
 the rotation position of each of the cam members or of each group including a plurality of the cam members is independently controllable by the controller, and
 the controller receives a measured result of the meter, and performs control of adjusting a rotation position of each cam member, based on the measured result, and of adjusting the workpiece to a predefined height position.

3. The laser anneal base stage according to claim 2, wherein an installation position of each of the cam members is fixed with respect to the irradiation position of the laser light, and other supports not including the cam members are movable together with the workpiece.

4. The laser anneal base stage according to claim 2, wherein each cam member includes a porous material at least on a gas blowing surface side thereof.

5. A laser anneal processing apparatus comprising:
 the laser anneal base stage according to claim 2;
 a laser light source that outputs laser light; and
 an optical system that guides the laser light, and irradiates the workpiece supported by the laser anneal base stage with the laser light.

* * * * *